United States Patent
Chen et al.

(10) Patent No.: US 7,436,011 B2
(45) Date of Patent: Oct. 14, 2008

(54) CMOS IMAGE SENSOR

(75) Inventors: Ching-Wei Chen, Hsin-Chu Hsien (TW); Chih-Cheng Hsieh, Hsin-Chu Hsien (TW); Chien-Chang Huang, Hsin-Chu Hsien (TW)

(73) Assignee: PixArt Imaging Inc., Hsin-Chu Hsien (TW)

( * ) Notice: Subject to any disclaimer, the term of this patent is extended or adjusted under 35 U.S.C. 154(b) by 0 days.

(21) Appl. No.: 11/164,096

(22) Filed: Nov. 10, 2005

(65) Prior Publication Data

US 2007/0102739 A1    May 10, 2007

(51) Int. Cl.
    *H01L 31/113* (2006.01)
(52) U.S. Cl. .............................. 257/292; 257/E27.131; 257/E31.113
(58) Field of Classification Search ......... 257/291–292, 257/E27.131, E27.133, E31.113
    See application file for complete search history.

(56) References Cited

U.S. PATENT DOCUMENTS 7,042,061 B2 *   5/2006  Nakamura et al. .......... 257/461
2004/0251398 A1  12/2004 Mouli
2005/0098806 A1*  5/2005 Rhodes ..................... 257/292
2005/0206765 A1   9/2005 Nakashima
2005/0274874 A1* 12/2005 Nozaki et al. ............ 250/208.1
2006/0081887 A1*  4/2006 Lyu .......................... 257/215
2006/0097296 A1*  5/2006 Nam ......................... 257/292
2006/0118835 A1*  6/2006 Ellis-Monaghan et al. .. 257/292

* cited by examiner

*Primary Examiner*—Lynne Gurley
*Assistant Examiner*—Colleen Matthews
(74) *Attorney, Agent, or Firm*—Winston Hsu

(57) ABSTRACT

A CMOS image sensor includes a semiconductor substrate; a pinned photodiode formed in a light-sensing region of the semiconductor substrate, the pinned photodiode comprising a charge-accumulating diffusion region and a surface pinning diffusion region overlying the charge-accumulating diffusion region; a transfer transistor, wherein the transfer transistor has a transfer gate comprising a protruding first gate segment with a first gate dimension and a second gate segment with a second gate dimension that is smaller than the first gate dimension. A first overlapping portion between the protruding first gate segment and the charge-accumulating diffusion region is greater than a second overlapping portion between the second gate segment and the charge-accumulating diffusion region.

19 Claims, 8 Drawing Sheets

CMOS IMAGE SENSOR

BACKGROUND OF THE INVENTION

1. Field of the Invention

The present invention relates to an image sensor and, more particularly, to a CMOS image sensor integrated with a pinned photodiode, which is capable of reducing clock feedthrough and improving dynamic range.

2. Description of the Prior Art

CMOS (complementary metal-oxide-semiconductor) image sensor or CMOS sensor is known in the art. Generally, a CMOS sensor includes a plurality of unit pixels having a light-sensing region and a peripheral circuit region. Each of the unit pixels also includes a light-sensing element such as a photodiode formed in the light-sensing region and a plurality of transistors formed on the peripheral circuit region. The photodiode senses incident light and accumulates image charges that are generated due to the incident light.

FIG. 1 illustrates a layout of four-transistor (4T) pixel cell 10 of a conventional CMOS sensor. FIG. 2 is a schematic, cross-sectional view of the CMOS sensor of FIG. 1 taken along line I-I'. The CMOS sensor pixel cell 10 includes a charge-accumulating region 20 in an underlying portion of the substrate. A pinned photodiode 22 is formed in the charge-accumulating region 20. A transfer gate 30 is provided for transferring photoelectric charges generated in the charge-accumulating region 20 to a floating diffusion region (sensing node) 25. The pinned photodiode is termed "pinned" because the potential in the photodiode is pinned to a constant value when the photodiode is fully depleted.

Typically, the floating diffusion region 25 is coupled to a gate 34 of a source follower transistor. The source follower transistor provides an output signal to a row select access transistor having a gate 36. A reset transistor having a gate 32 resets the floating diffusion region 25 to a specified charge level before each charge transfer from the charge-accumulating region 20. As best seen in FIG. 1, N-type doped source/drain regions 27 are provided on either side of the transistor gates 32, 34, 36. The floating diffusion region 25 adjacent the transfer gate 30 is also N-type.

As best seen in FIG. 2, the charge-accumulating region 20 is formed as a pinned photodiode 22, which has a PNP junction region consisting of a surface $P^+$ pinning layer 24, an N-type photodiode region 26 and a P-type substrate 12. The pinned photodiode 22 includes two P-type regions 12, 24 so that the N-type photodiode region 26 is fully depleted at a pinning voltage. Trench isolation regions 15 are formed in the P-type substrate 12 adjacent the charge-accumulating region 20. The trench isolation regions 15 are typically formed using a conventional shallow trench isolation (STI) process or by using a local oxidation of silicon (LOCOS) process.

CMOS sensors typically suffer from narrow dynamic range and poor charge transfer efficiency. As shown in FIG. 2, the overlapping portion between the gate 30 and the underlying N-type photodiode region 26 is designated as "A". It has been known that in order to increase the charge transfer efficiency of the CMOS sensor, "A" should be made as large as possible. The distance between the surface $P^+$ pinning layer 24 and the P type substrate 12 underneath the gate 30 is designated as "B". If the distance "B" is too small, pinch-off occurs resulting in narrow dynamic range and undesirable image lags.

A conventional non-self alignment method for forming the pixel sensor can provide larger overlapping portion "A" and distance "B". According to the conventional non-self-alignment method, the N type photodiode region 26 is implanted into the pre-selected areas of the P-type substrate 12 using a photomask prior to the definition of the transfer gate 30. However, the prior art non-self-aligned method suffers from so-called fixed pattern noise due to misalignment of the lithography and non-uniformity of the overlapping portion "A" among pixels.

Referring to FIG. 3, a schematic potential diagram of a CMOS sensor during operation is demonstrated. On the other hand, the above-described prior art CMOS sensor has another drawback in that a potential "pocket" indicated by numeral number 50 forms due to an excessively large overlapping portion "A". The potential "pocket" 50 is caused by a large number of trapped electrons accumulated underneath the gate 30, which leads to deteriorated clock feed-through of the gate 30 of the transfer transistor, image lag, and also poor dynamic range.

SUMMARY OF THE INVENTION

It is one object of the present invention to provide an improved CMOS image sensor integrated with a pinned photodiode, which is capable of reducing clock feedthrough, image lag, and improving dynamic range.

According to the claimed invention, a CMOS image sensor is disclosed. The CMOS image sensor includes a semiconductor substrate of a first conductivity type; a pinned photodiode formed in a light-sensing region of the semiconductor substrate, the pinned photodiode comprising a charge-accumulating diffusion region of a second conductivity type and a surface pinning diffusion region of the first conductivity type overlying the charge-accumulating diffusion region; and a transfer transistor formed on the semiconductor substrate, the transfer transistor being adjacent to the pinned photodiode, wherein the transfer transistor has a transfer gate comprising a protruding first gate segment with a first gate dimension and a second gate segment with a second gate dimension that is smaller than the first gate dimension; wherein a first overlapping portion between the protruding first gate segment and the charge-accumulating diffusion region being greater than a second overlapping portion between the second gate segment and the charge-accumulating diffusion region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
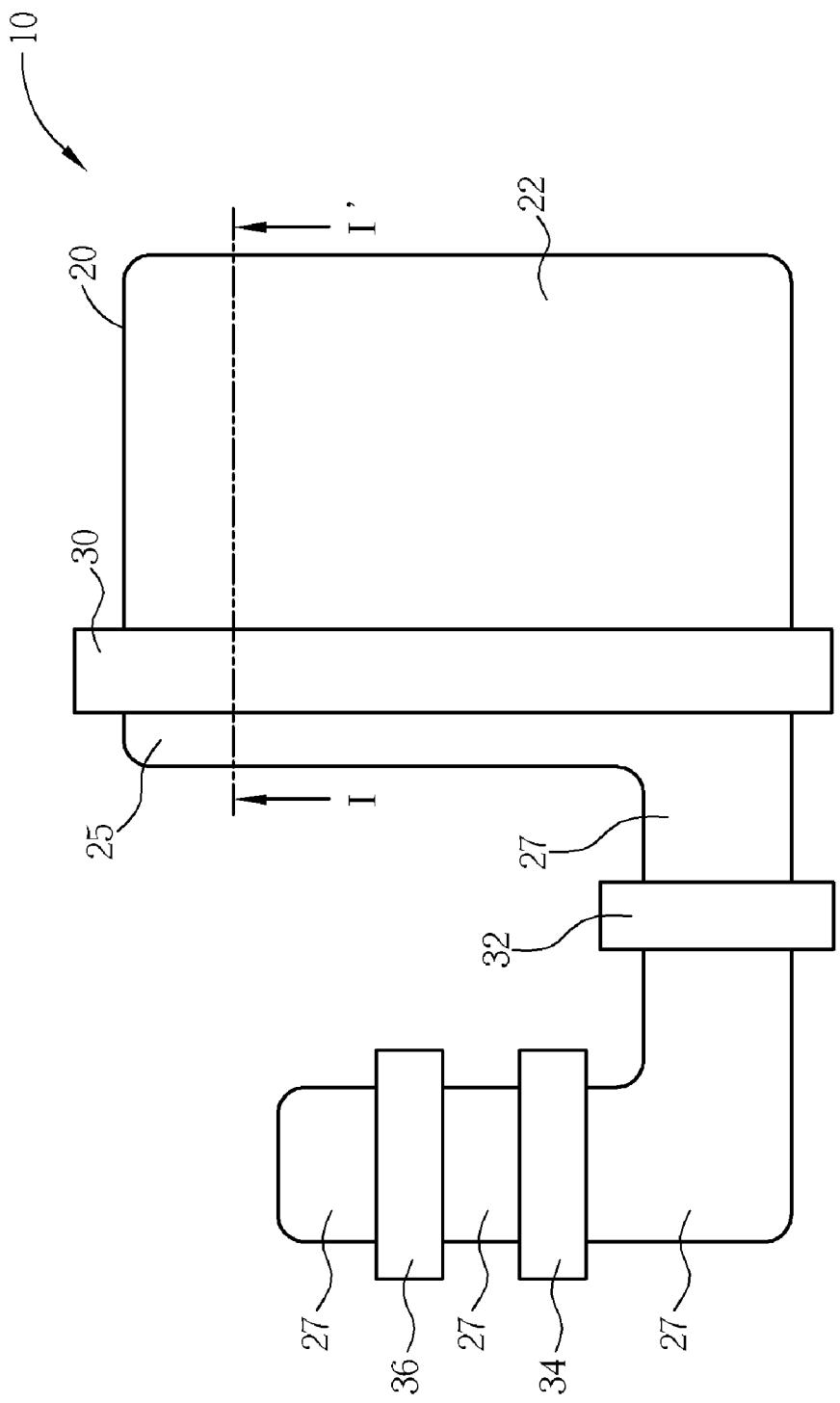
FIG. 1 illustrates a layout of four-transistor (4T) pixel cell of a conventional CMOS sensor.
Figure 2:
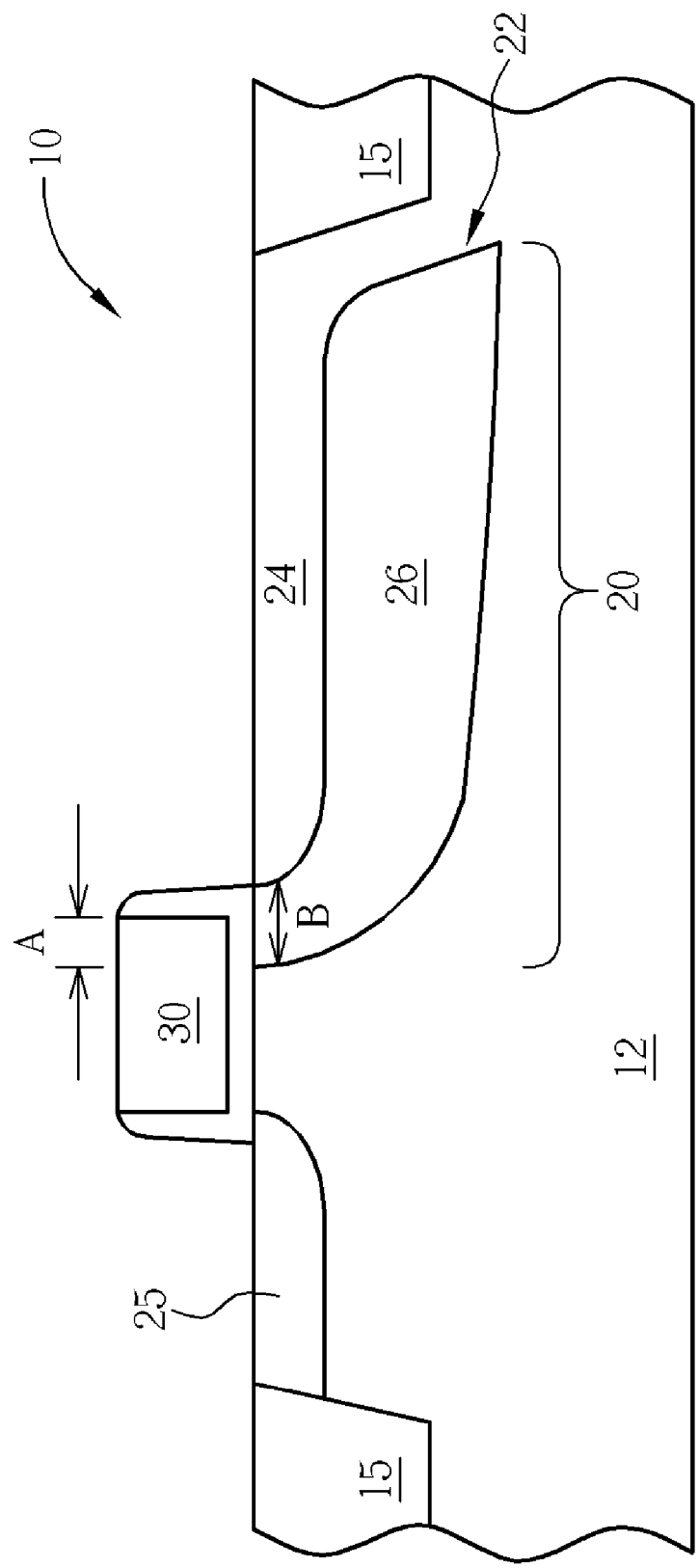
FIG. 2 is a schematic, cross-sectional view of the CMOS sensor of FIG. 1 taken along line I-I'.
Figure 3:
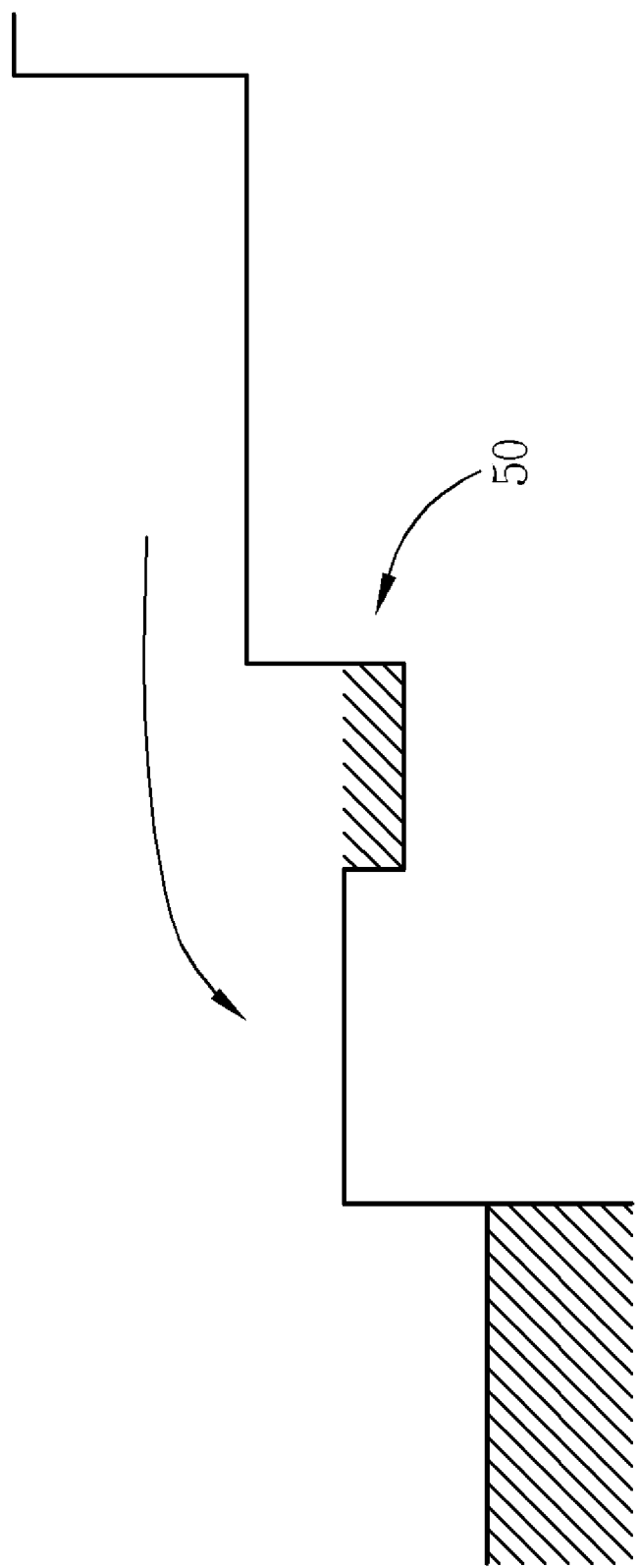
FIG. 3 is a schematic potential diagram of a CMOS sensor during operation according to the prior art.
Figure 4:
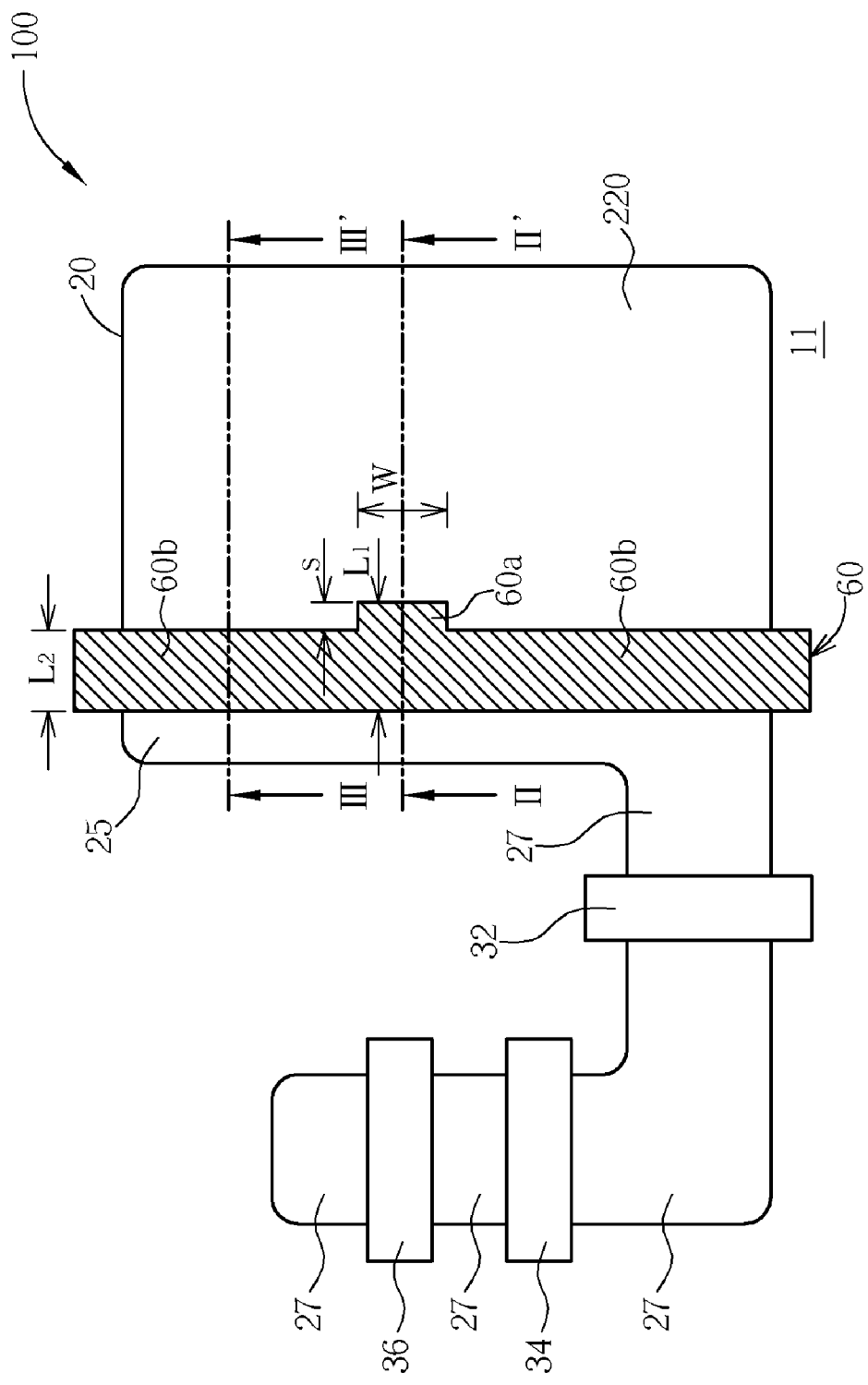
FIG. 4 is a top view of an exemplary 4T pixel cell of a CMOS sensor according to one preferred embodiment of this invention.
Figure 5:
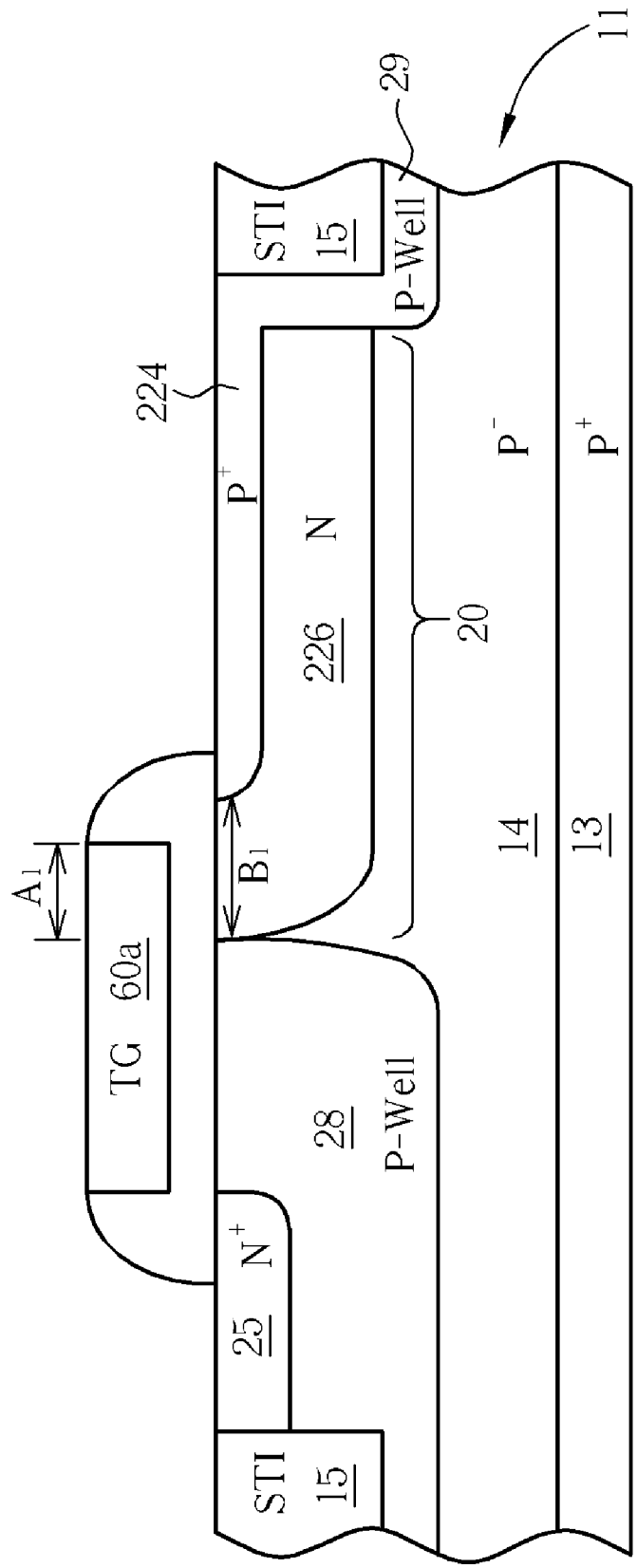
FIG. 5 is a schematic, cross-sectional diagram taken along line II-II' of FIG. 4.
Figure 6:
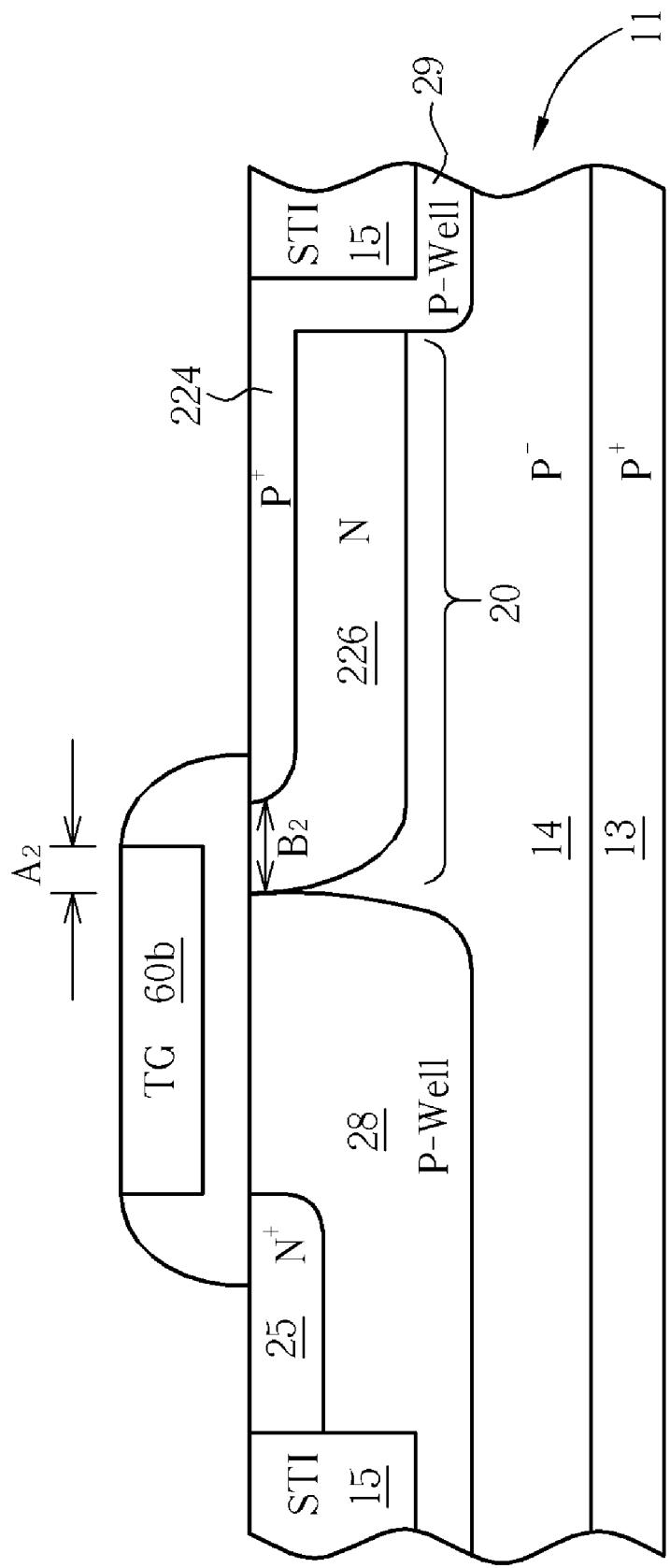
FIG. 6 is a schematic, cross-sectional diagram taken along line III-III' of FIG. 4.

Please refer to FIGS. 4-6. FIG. 4 is a top view of an exemplary four-transistor (4T) pixel cell of a CMOS sensor 100 according to one preferred embodiment of this invention; and FIGS. 5 and 6 are schematic, cross-sectional diagrams taken along line II-II' and line III-III' of FIG. 4, respectively, where like numeral numbers designate like elements, regions or layers.

As shown in FIG. 4, the CMOS sensor 100 comprises a charge-accumulating region 20 in an underlying portion of a substrate 11. A pinned photodiode 220 is formed in the charge-accumulating region 20. A transfer gate 60 is provided for transferring photoelectric charges generated in the charge-accumulating region 20 to a floating diffusion region (sensing node) 25.

The floating diffusion region 25 is coupled to a gate 34 of a source follower transistor. The source follower transistor provides an output signal to a row select access transistor having a gate 36. A reset transistor having a gate 32 resets the floating diffusion region 25 to a specified charge level before each charge transfer from the charge-accumulating region 20.

According to the preferred embodiment, N-type doped source/drain regions 27 are provided on either side of the transistor gates 32, 34, 36. The floating diffusion region 25 adjacent the transfer gate 30 is also preferably N-type.

As specifically indicated in FIG. 4, in accordance with the preferred embodiment of this invention, the transfer gate 60 includes a protruding first gate segment 60a with a first gate dimension $L_1$ and a second gate segment 60b with a second gate dimension $L_2$. According to the preferred embodiment, the first gate dimension $L_1$ is greater than the second gate dimension $L_2$ by an offset S ($L_1=L_2+S$). Preferably, the offset S is smaller than the second gate dimension $L_2$. By way of example, the second gate dimension $L_2$ may range between 0.1 micrometer and 0.8 micrometer, and the offset S may range between 0.05 micrometer and 0.6 micrometer, but not limited thereto.

The protruding first gate segment 60a, which juts out toward the light-sensing area 20, has a width designated as W, which preferably ranges between 0.1 micrometer and 1.0 micrometer. Preferably, the protruding first gate segment 60a is disposed approximately at the midpoint of the gate 60.

As shown in FIGS. 5 and 6, the pinned photodiode 220 is formed in light-sensing region 20 of the semiconductor substrate 11. The pinned photodiode 220 comprises an N-type charge-accumulating diffusion region 226 and a surface $P^+$ pinning layer 224 overlying the charge-accumulating diffusion region 226, and a $P^-$ substrate 14. The $P^-$ substrate 14 may be an P type epitaxial layer grown on a $P^+$ silicon substrate 13.

Trench isolation regions 15 are formed in the $P^-$ substrate 14 adjacent the charge-accumulating region 20. The trench isolation regions 15 are typically formed using a conventional shallow trench isolation (STI) process or by using a local oxidation of silicon (LOCOS) process.

Further, P wells 28 and 29 are formed in the $P^-$ substrate 14. The P well 28,which encompasses the floating diffusion 25 and the STI 15, is situated under the gate 60 and is in contiguous with the N-type charge-accumulating diffusion region 226. It is to be understood that the P well 28 is optional. The surface $P^+0$ pinning layer 224 is contiguous or merged with the P well 29 that encompasses the STI 15.

It is one salient feature of the present invention that a first overlapping portion $A_1$ between the first gate segment 60a and the charge-accumulating diffusion region 226 (shown in FIG. 5) is greater than a second overlapping portion $A_2$ between the second gate segment 60b and the charge-accumulating diffusion region 226 (shown in FIG. 6).

Figure 7:
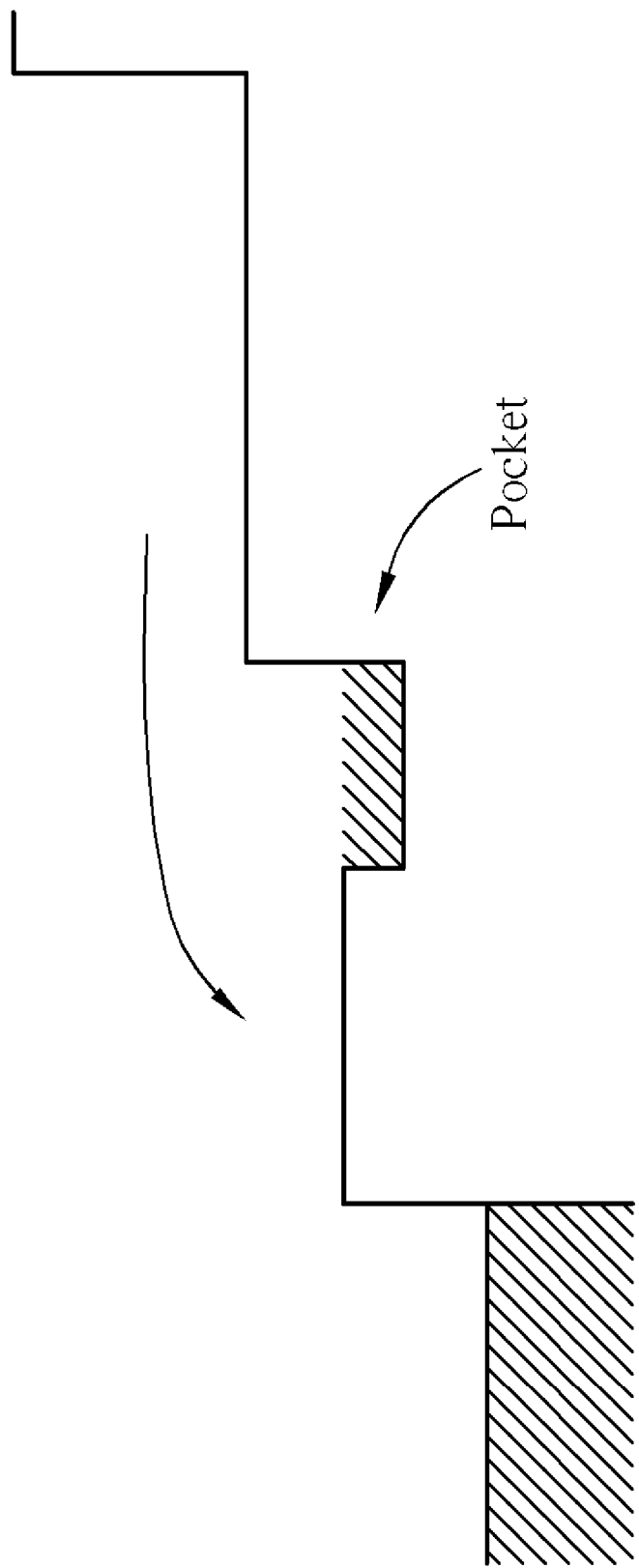
FIG. 7 is a schematic potential diagram with respect to the photodiode structure set forth in FIG. 5.
Figure 8:
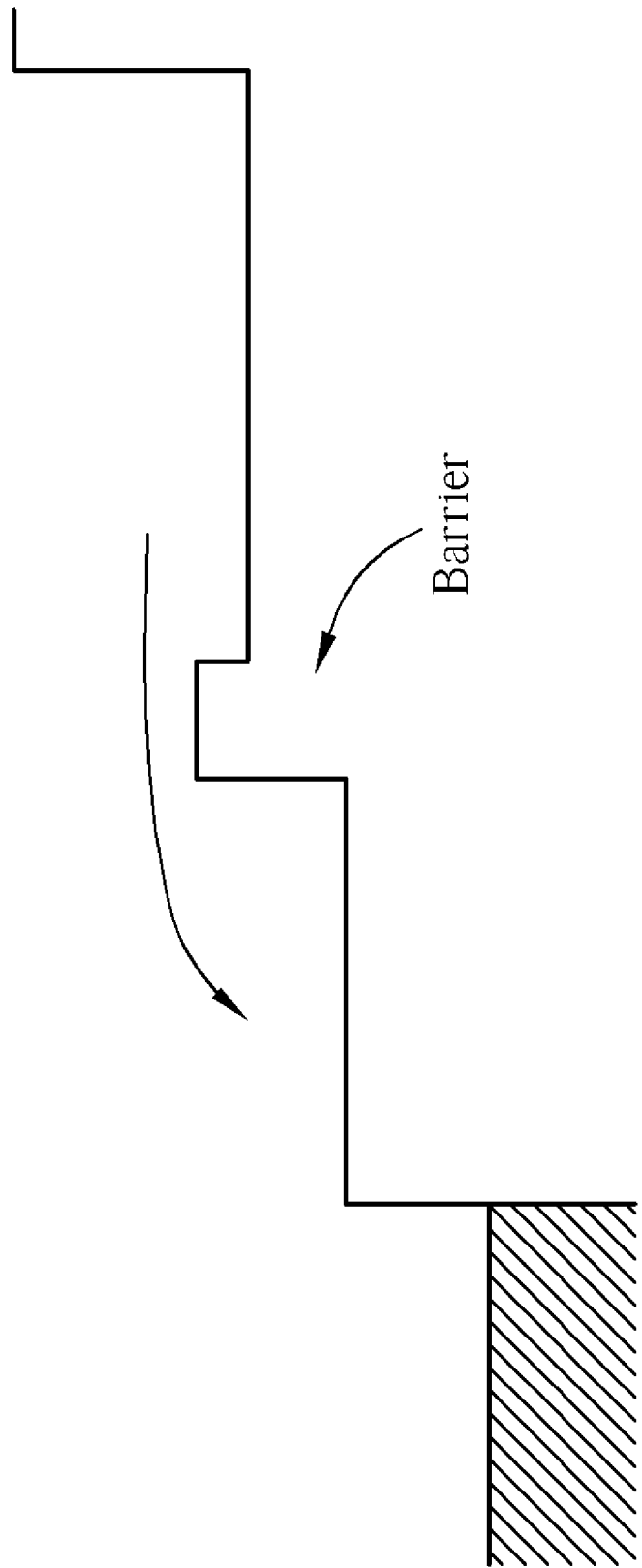
FIG. 8 is a schematic potential diagram with respect to the photodiode structure set forth in FIG. 6.

The advantages of the present invention are demonstrated in FIGS. 7-8. FIG. 7 is a schematic potential diagram with respect to the photodiode structure set forth in FIG. 5. FIG. 8 is a schematic potential diagram with respect to the photodiode structure set forth in FIG. 6. In operation, as seen in FIG. 8, a small overlapping portion $A_2$ between the second gate segment 60b and the charge-accumulating diffusion region 226 and short distance $B_2$ between the surface $P^+$ pinning layer 224 and the P well 28 lead to early pinch-off and a potential barrier formation.

The amount of the trapped electrons is reduced, thus preventing a potential "pocket" from occurring underneath the second gate segment 60b. This helps to reduce clock feedthrough of the transfer gate 60 and also widen dynamic range. As seen in FIG. 7, a shrunk potential "pocket" merely occurs directly under the protruding first gate segment 60a. When the charge-accumulating diffusion region 226 is depleted, electrons tend to transfer through underneath the protruding first gate segment 60a. Since the overlapping portion $A_1$ between the first gate segment 60a and the charge-accumulating diffusion region 226 and the distance $B_1$ between the pinning layer 224 and the P well 28 are both greater, no pinch-off occurs and thus no obvious barrier is formed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A CMOS image sensor, comprising:
  a semiconductor substrate of a first conductivity type;
  a pinned photodiode formed in a light-sensing region of said semiconductor substrate, said pinned photodiode comprising a charge-accumulating diffusion region of a second conductivity type and a surface pinning diffusion region of said first conductivity type overlying said charge-accumulating diffusion region; and
  a transfer transistor adjacent to said pinned photodiode, wherein the transfer transistor has a transfer gate having at least two different gate lengths, and said transfer gate comprises a first gate segment and a second gate segment overlapping with said charge-accumulating diffusion region, wherein said first gate segment is longer than said second gate segment by a predetermined offset in a gate lengthwise direction; and wherein a first overlapping portion between said first gate segment and said charge-accumulating diffusion region is greater than a second overlapping portion between said second gate segment and said charge-accumulating diffusion region.

2. The CMOS image sensor according to claim 1, wherein a shallow trench isolation (STI) region adjacent to said light-sensing region is provided, and wherein a first diffusion well of said first conductivity type is provided in said semiconductor substrate to encompass said STI region, and said first diffusion well is contiguous with said surface pinning diffusion region.

3. The CMOS image sensor according to claim 1, wherein said predetermined offset is smaller than the gate length of said second gate segment.

4. The CMOS image sensor according to claim 1, wherein said first conductivity type is P type, and said second conductivity type is N type.

5. The CMOS image sensor according to claim 1, wherein said CMOS image sensor further comprises a reset transistor, a source follower transistor and a select transistor.

6. The CMOS image sensor according to claim 1, wherein said first gate segment is disposed approximately at midpoint of said transfer gate.

7. The CMOS image sensor according to claim 1, wherein a second diffusion well of said first conductivity type is provided in said semiconductor substrate under said transfer gate, and wherein said second diffusion well encompasses a floating sensing node of said second conductivity type.

8. The CMOS image sensor according to claim 7, wherein said second diffusion well is in contiguous with said charge-accumulating diffusion region.

9. A CMOS image sensor, comprising:
a semiconductor substrate of a first conductivity type;
a pinned photodiode formed in a light-sensing region of said semiconductor substrate, said pinned photodiode comprising a charge-accumulating diffusion region of a second conductivity type and a surface pinning diffusion region of said first conductivity type overlying said charge-accumulating diffusion region; and
a transfer transistor adjacent to said pinned photodiode, wherein the transfer transistor has a transfer gate comprising a mid gate segment sandwiched between two sided gate segments, wherein said mid gate segment protrudes from a gate edge of both said sided gate segments, wherein both of said two sided gate segments overlap with said charge-accumulating diffusion region, and wherein a first overlapping portion between said mid gate segment and said charge-accumulating diffusion region is greater than a second overlapping portion between either one of said sided gate segment and said charge-accumulating diffusion region.

10. The CMOS image sensor according to claim 9, wherein said mid gate segment juts out from one side of said transfer gate toward said light-sensing region.

11. The CMOS image sensor according to claim 9, wherein a shallow trench isolation (STI) region adjacent to said light-sensing region is provided, and wherein a first diffusion well of said first conductivity type is provided in said semiconductor substrate to encompass said STI region, and said first diffusion well is contiguous with said surface pinning diffusion region.

12. The CMOS image sensor according to claim 9, wherein said first gate segment is longer than said second gate segment by a predetermined offset in a gate lengthwise direction, and wherein said predetermined offset is smaller than a gate length of said sided gate segments.

13. The CMOS image sensor according to claim 9, wherein said first conductivity type is P type, and said second conductivity type is N type.

14. The CMOS image sensor according to claim 9, wherein said CMOS image sensor further comprises a reset transistor, a source follower transistor and a select transistor.

15. The CMOS image sensor according to claim 9, wherein a second diffusion well of said first conductivity type is provided in said semiconductor substrate under said transfer gate, and wherein said second diffusion well encompasses a floating sensing node of said second conductivity type.

16. The CMOS image sensor according to claim 15, wherein said second diffusion well is in contiguous with said charge-accumulating diffusion region.

17. A CMOS image sensor, comprising:
a semiconductor substrate of a first conductivity type;
a first diffusion well of said first conductivity type in said semiconductor substrate;
a pinned photodiode formed in a light-sensing region of said semiconductor substrate, said pinned photodiode comprising a charge-accumulating diffusion region of a second conductivity type and a surface pinning diffusion region of said first conductivity type overlying said charge-accumulating diffusion region; and
a transfer transistor adjacent to said pinned photodiode, wherein the transfer transistor has a transfer gate comprising a first gate segment and a second gate segment, wherein a first full gate length of said first gate segment is greater than a second full gate length of said second gate segment by a predetermined offset; and a first overlapping portion between said first gate segment and said charge-accumulating diffusion region is greater than a second overlapping portion between said second gate segment and said charge-accumulating diffusion region, and wherein pinch-off occurs between said surface pinning diffusion region and said first diffusion well with a potential barrier under said second overlapping portion, and substantially no pinch-off occurs between said surface pinning diffusion region and said first diffusion well under said first overlapping portion.

18. The CMOS image sensor according to claim 17, wherein a shallow trench isolation (STI) region adjacent to said light-sensing region is provided, and wherein the first diffusion well of said first conductivity type encompasses said STI region, and said first diffusion well is contiguous with said surface pinning diffusion region.

19. The CMOS image sensor according to claim 17, wherein the potential barrier between said surface pinning diffusion region and said first diffusion well under said second overlapping portion reduces trapped electrons, and prevents a potential pocket from occurring under said second gate segment, thereby reducing clock feedthrough of said transfer gate and widening dynamic range of said CMOS image sensor.

* * * * *